United States Patent
Matsui et al.

(10) Patent No.: US 8,304,905 B2
(45) Date of Patent: Nov. 6, 2012

(54) SEMICONDUCTOR DEVICE

(75) Inventors: Satoshi Matsui, Kanagawa (JP);
Tsuyoshi Eda, Kanagawa (JP); Akira Matsumoto, Kanagawa (JP); Yoshitaka Kyougoku, Kanagawa (JP); Shinji Watanabe, Kanagawa (JP); Hirokazu Honda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/192,049

(22) Filed: Jul. 27, 2011

(65) Prior Publication Data

US 2012/0025371 A1    Feb. 2, 2012

(30) Foreign Application Priority Data

Jul. 27, 2010   (JP) ................ 2010-168686

(51) Int. Cl.
    *H01L 23/48*      (2006.01)
    *H01L 29/40*      (2006.01)

(52) U.S. Cl. ........ 257/737; 257/738; 257/778; 257/780; 438/613

(58) Field of Classification Search .......... 257/737–738, 257/778, 780, E23.012; 438/613
See application file for complete search history.

(56) References Cited

U.S. PATENT DOCUMENTS

| | | | | |
|---|---|---|---|---|
| 4,268,849 | A | * | 5/1981 | Gray et al. ............. 257/745 |
| 5,665,996 | A | * | 9/1997 | Williams et al. ......... 257/401 |
| 6,927,489 | B1 | | 8/2005 | Yaguchi et al. |
| 7,180,185 | B2 | | 2/2007 | Ohsumi |

FOREIGN PATENT DOCUMENTS

| | | |
|---|---|---|
| JP | 2000-243874 | 9/2000 |
| JP | 2000-269371 | 9/2000 |
| JP | 2005-026679 | 1/2005 |
| JP | 2009-123862 | 6/2009 |

* cited by examiner

*Primary Examiner* — Theresa T Doan
(74) *Attorney, Agent, or Firm* — Young & Thompson (57) ABSTRACT

A semiconductor device includes a semiconductor chip, wiring formed thereon, a first insulating film formed on the wiring, provided with a first opening, a pad electrode formed so as to be in contact with the wiring, a second insulating film formed on the pad electrode film, provided with a second opening, and a flip chip bump formed so as to be in contact with the pad electrode film. In this case, the second insulating film exists between the flip chip bump and the pad electrode film, in a region directly underneath the outer edge of the flip chip bump, as seen in a plan view, and the outer edge of the flip chip bump is formed in a region inside the outer edge of the pad electrode film.

14 Claims, 12 Drawing Sheets

SEMICONDUCTOR DEVICE

CROSS-REFERENCE TO RELATED APPLICATIONS

The disclosure of Japanese Patent Application No. 2010-168686 filed on Jul. 27, 2010 including the specification, drawings and abstract is incorporated herein by reference in its entirety.

BACKGROUND

The present invention relates to a semiconductor device.

To cope with an increase in the number of pins of a semiconductor chip, a bump pitch for flip chip bonding has lately become smaller. Because a related-art solder bump containing tin, and lead, as principal constituents, is turned bead-like in shape due to heat when the semiconductor chip is connected to a substrate, it has been difficult to realize miniaturization of a semiconductor device while maintaining a gap between the semiconductor chip, and a printed circuit board, and so forth. Meanwhile, it is recommended that a lead-free solder be substituted for a lead-base solder that was used as the constituent material of a bump in the past although the former is inferior to the latter in respect of melting point and ductility. Since the lead-free solder undergoes re-melting due to heat treatment in a back-end process such as a secondary bonding, and so forth, there exists a problem in that if a void exists in an under-fill material filling up the gap between the semiconductor chip, and the board, a molten solder will come into contact with a solder adjacent thereto, thereby causing a short circuit. In an attempt to solve those problems, development of a copper pillar technology for making use of copper for the constituent material of a bump has been underway. However, there has existed a problem that copper is harder as compared with the lead-base solder of the related art, and stress occurring to a bump due to a difference in coefficient of thermal expansion between the semiconductor chip, and the board will directly act on the semiconductor chip.

In Japanese Application Publication No. 2000-269371, there is described a configuration in which a projection is formed on a land which is a junction part of an external terminal of a semiconductor device, a protruding part of the projection is bonded with the external terminal, and further, an intercalated portion of a protection film made of a resin material is formed between the land and a semiconductor element. It is further described that the protection film is normally smaller in elastic coefficient than a land-forming material, and an external-terminal forming-material, and if the protection film is interposed between the land to which the external terminal is bonded, and a passivation film formed on the surface of the semiconductor element, this will enable deformation occurring to the external terminal owing to a difference in coefficient of linear expansion between the semiconductor device, and a printed circuit board to be mitigated by the agency of deformation occurring to the protection film. It is stated that by so doing, it is possible to reduce distortion occurring to respective junctions on the respective parts of the semiconductor device, and the printed circuit board.

In Japanese Application Publication No. 2000-243874, there is described a semiconductor device of the following configuration. An insulating coating is formed on the surface of a semiconductor chip, with an electrode terminal formed thereon, by exposing the electrode terminal of the semiconductor chip. Wiring patterns on one end side thereof, connected to the electrode terminal of the semiconductor chip, are formed on the insulating coating, and columnar electrodes are erected on the respective surfaces of lands formed on the other end side of the respective wiring patterns. There is formed a seal layer for sealing the surface of the semiconductor chip by exposing the top end face of each of the columnar electrodes. And the columnar electrode erected on the surface of the land is formed of a core made of a conductive metal, and a metal column formed by electroplating applied so as to embed the core. It is stated that by so doing, it is possible to increase the stress relaxation action of the columnar electrode while enhancing adhesion between the columnar electrode, and the land, and to shorten manufacturing time.

In Japanese Application Publication No. 2009-123862, there is described a semiconductor device including a semiconductor substrate with an electrode pad formed thereon, in conduction with a predetermined electronic circuit, a rewiring layer covering the electrode pad on the semiconductor substrate, and including a current-carrying part electrically connected to the electrode pad, a conductor post in a pillar-like shape, provided in a region on the rewiring layer, where the electrode pad is formed in the under-layer thereof, a part of the bottom surface of the conductor post, in contact with the rewiring layer, covering the electrode pad disposed in the under-layer, in whole, while being in conduction with the current-carrying part, and an external electrode formed in a predetermined region of the conductor post.

Figure 12:
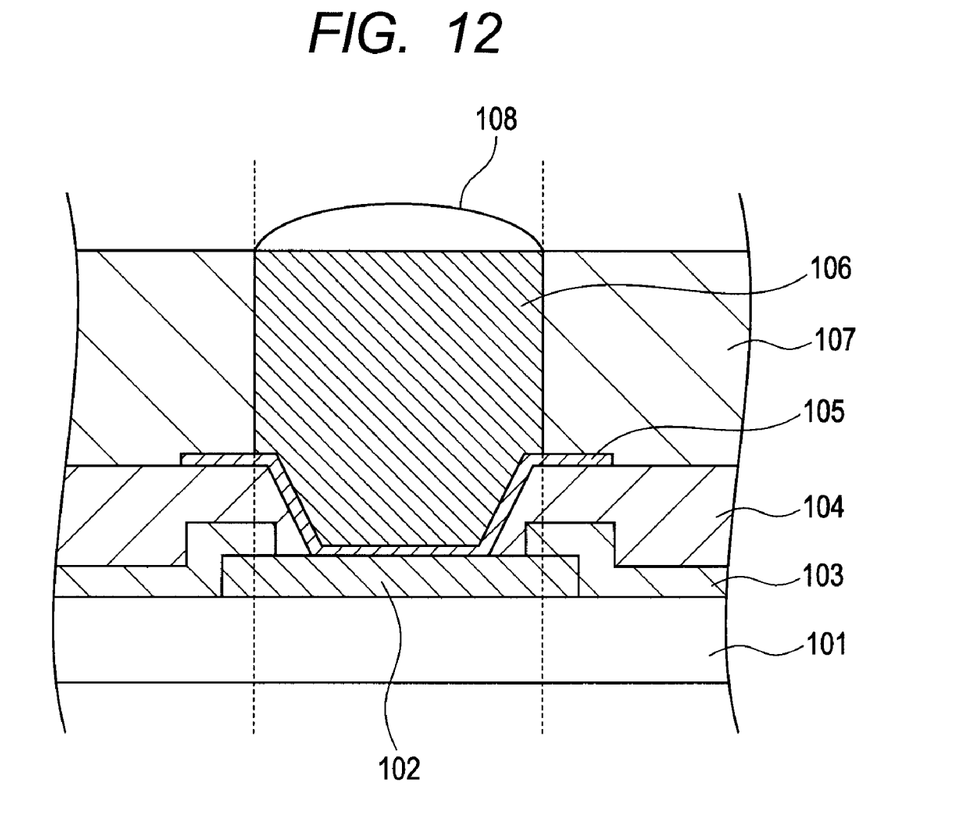
FIG. 12 is a sectional view showing a configuration of a semiconductor device of the related art.

In Japanese Application Publication No. 2005-26679 as well, there is described a semiconductor device including a projection electrode. FIG. 12 shows a configuration of the semiconductor device in section. The semiconductor device includes a semiconductor substrate 101, an electrode pad 102, a passivation film 103 having a first opening for exposing a part of the surface of the electrode pad 102, an insulating film 104 having a second opening for exposing a part of the surface of the electrode pad 102, a projection electrode 106 having an outer edge, and a sealing resin 107. Wiring 105 is provided between the electrode pad 102, and the projection electrode 106, and an external terminal is provided on the surface of the projection electrode 106. The projection electrode 106 is disposed over the electrode pad 102 such that the outer edge is not superimposed on the second opening. In the case of a semiconductor device having a CSP structure, stress of a projection electrode portion thereof, converges on the edge thereof (a peripheral part, or an outer edge), however, by forming the opening of the insulating film 104 so as to be positioned directly underneath the projection electrode 106 and to be small in size such that the opening is included in the projection electrode in section, and by supporting the edge of the projection electrode, the stress converging thereon, with the insulating film 104 formed of polyimide and so forth, having relatively high elasticity, and a stress relaxation function, the passivation film 103, and the electrode pad 102, disposed underneath the insulating film 104, are protected from occurrence of cracking.

SUMMARY

With a configuration of the related art, however, relaxation of stress acting on a semiconductor chip has been insufficient. If such stress acts on the semiconductor chip, there arises a problem that an interlayer dielectric on a side of the device, adjacent to the semiconductor chip, undergoes breakdown.

Figure 13:
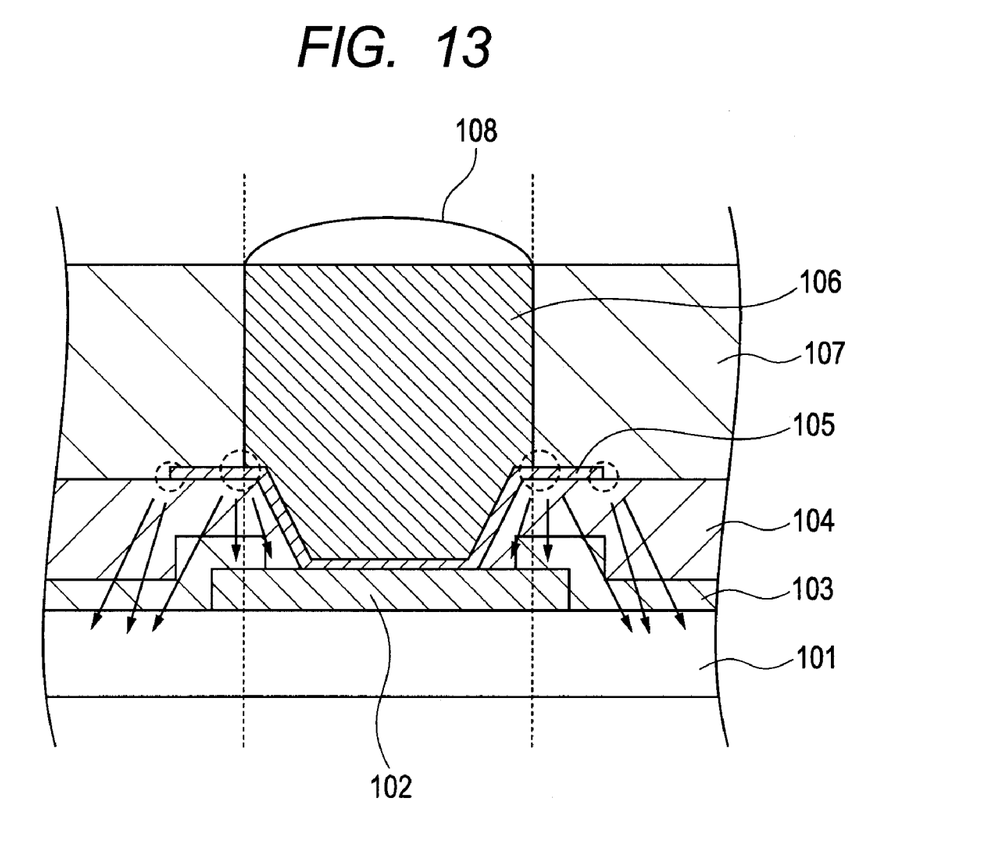
FIG. 13 is a schematic representation for explaining about a problem point with the semiconductor device of the related art.

FIG. 13 is a schematic representation for explaining about a problem point in the semiconductor device, described in Japanese Application Publication No. 2005-26679.

When the projection electrode 106 (a bump for the flip chip bonding) is bonded to a printed circuit board, and so forth, the projection electrode 106 is tilted due to contraction occurring to the printed circuit board. At this point in time, a large displacement occurs to end parts of the projection electrode 106, whereupon stress acts on corners indicated by broken lines in the figure. The stress applied to the projection electrode 106 is propagated downward. Now, since the edge of the projection electrode 106 is covered by the insulating film 104 formed of polyimide and so forth, the stress can be expected to be absorbed to some extent by the insulating film 104. However, a portion of the stress, having failed to be absorbed by the insulating film 104, is propagated, as it is, to a side of the device, adjacent to the semiconductor substrate 101, thereby raising the risk that breakdown occurs to, for example, an insulating film (an insulating film low in dielectric constant, in particular) in the semiconductor substrate 101. Furthermore, the stress acting on the projection electrode 106 is propagated to the wiring 105 as well, so that the stress is also applied to the outer edge of the wiring 105. Accordingly, the stress applied to the outer edge of the wiring 105 is also propagated, as it is, to the side of the device, adjacent to the semiconductor substrate 101.

According to one aspect of the present invention, a semiconductor device includes a substrate, wiring formed on the substrate, a first insulating film formed on the wiring, provided with a first opening for exposing a portion of the wiring, a pad electrode film formed on the first insulating film, the pad electrode film being formed so as to be in contact with the entire surface of a portion of the wiring, exposed from the first opening of the first insulating film, a second insulating film formed on the first insulating film, and the pad electrode film, a second opening for exposing a portion of the pad electrode film being formed in the second insulating film, and a flip chip bump formed on the second insulating film, the flip chip bump being formed in such a manner as to be in contact with the entire surface of a portion of the pad electrode film, exposed from the second opening of the second insulating film, and the second insulating film exists between the flip chip bump and the pad electrode film, in a region directly underneath an outer edge of the flip chip bump, as seen in a plan view, and the outer edge of the flip chip bump is formed in a region inside the outer edge of the pad electrode film, as seen in a plan view.

Stress acting on the flip chip bump is propagated downward; however, with the adoption of such a configuration described as above, the second polyimide resin film exists between the flip chip bump and the pad electrode film, in the region directly underneath the outer edge of the flip chip bump, as seen in a plan view. For this reason, the second polyimide resin film can absorb the stress acting on the pad electrode film through the intermediary of the flip chip bump. Further, the flip chip bump is formed such the outer edge thereof is inside the region of the outer edge of the pad electrode film, and the pad electrode film is in the shape extended outward so as to be wider than the flip chip bump. Accordingly, it is possible to block stress by the agency of the pad electrode film, and to more effectively relax stress propagated to the side of the device, adjacent to the semiconductor chip, through the intermediary of the flip chip bump. Further, it is possible to inhibit breakdown otherwise occurring to the insulating film (the insulating film low in dielectric constant, in particular) in the semiconductor chip. Further, it is also possible to inhibit exfoliation of the flip chip bump from the semiconductor chip.

BRIEF DESCRIPTION OF THE DRAWINGS

The above and other objects, advantages and features of the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferred embodiments of the invention are described hereinafter with reference to the accompanying drawings. Similar constituent elements in all figures are denoted by like reference numerals, respectively, omitting description thereof as appropriate.

Figure 1:
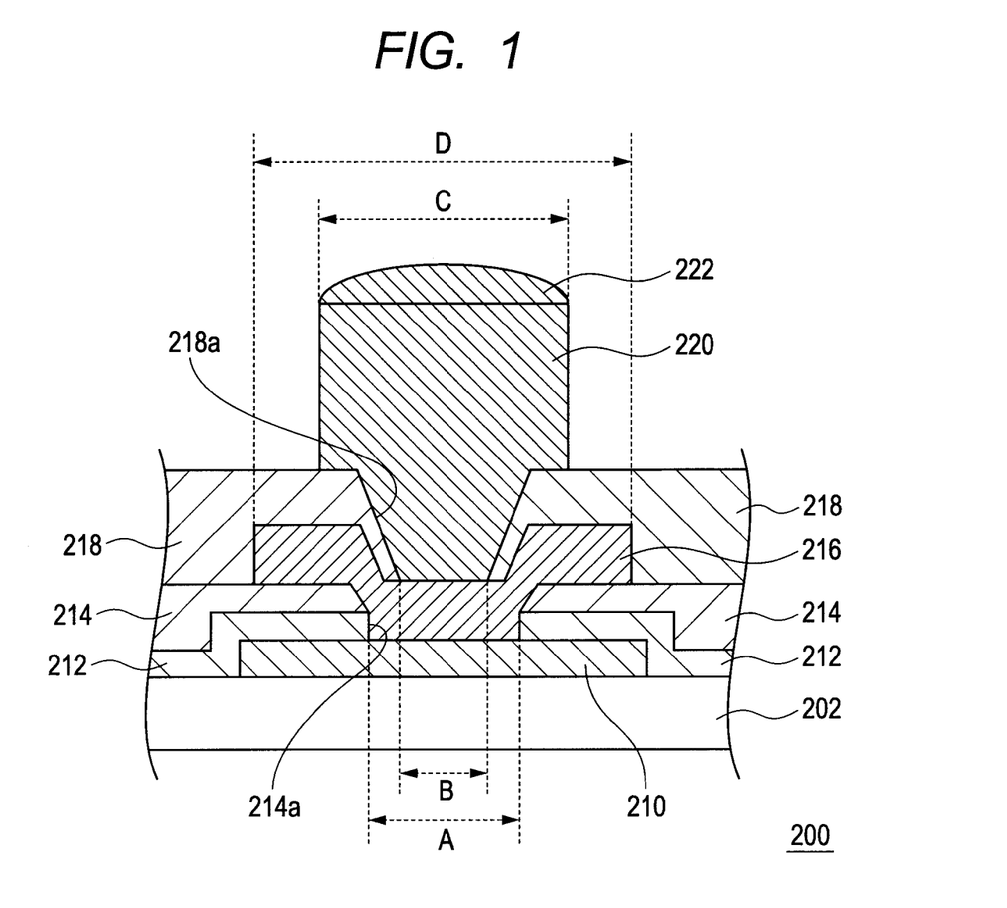
FIG. 1 is a sectional view showing one example of a configuration of a semiconductor device according to an embodiment of the invention.

FIG. 1 is a sectional view showing one example of a configuration of a semiconductor device according to an embodiment of the invention.

A semiconductor device 200 includes a semiconductor chip 202, and wiring 210 formed on the semiconductor chip 202. The semiconductor chip 202 can be configured such that elements such as a transistor, and so forth are formed on a substrate, and a multi-level interconnect structure is further formed thereon. That is, it is possible to adopt a configuration wherein the multi-level interconnect structure is formed between the substrate, and the wiring 210. For the substrate, use can be made of, for example, a semiconductor substrate such as a silicon substrate, and so forth. Further, the multi-level interconnect structure formed on the substrate can be of a configuration wherein wiring and via holes are formed in a structure in which insulating films, such as interlayer dielectrics, and so forth, are stacked. Furthermore, with the present embodiment of the invention, an insulating film low in dielectric constant (a Low-k film) can be included in at least a part of the insulating films in the multi level interconnect structure. The wiring 210 functions as a chip electrode, and can be made of, for example, aluminum, copper, and so forth.

Further, a cover insulating film 212, and a first polyimide resin film 214 (a first insulating film) are formed in this order on the wiring 210 disposed on the semiconductor chip 202, and a first opening 214a for exposing a part of the wiring 210 is formed in the cover insulating film 212, and the first polyimide resin film 214, respectively. The cover insulating film 212 can be made up of, for example, a silicon oxide ($SiO_2$) film, a SiO film, or a stacked film made up of these films.

Further, a pad electrode film (a rewiring layer) 216 that is formed so as to be in contact with the entire surface of a portion of the wiring 210, exposed from the first opening 214a of the first polyimide resin film 214 as well as the cover insulating film 212, is formed on the first polyimide resin film 214. The pad electrode film 216 can be made of, for example, copper and so forth.

Still further, a second polyimide resin film 218 (a second insulating film) is formed on the pad electrode film 216 as well as the first polyimide resin film 214, and a second opening 218a for exposing a portion of the pad electrode film 216 is formed in the second polyimide resin film 218.

A flip chip bump 220 is formed on the second polyimide resin film 218, the flip chip bump 220 being formed in such a manner as to be in contact with the entire surface of a portion of the pad electrode film 216, exposed from the second opening 218a of the second polyimide resin film 218. With the present embodiment, the flip chip bump 220 can be formed in the shape of a copper pillar made of copper. The flip chip bump 220 includes a via part formed in the second polyimide resin film 218, and provided in such a way so as to in contact with the pad electrode film 216, and a pillar part formed so as to be exposed outside the second opening 218a on the second polyimide resin film 218. With the present embodiment, the second polyimide resin film 218 is formed around a sidewall of the via part.

More specifically, the pad electrode film 216 as well includes a via part formed in the cover insulating film 212, and the first polyimide resin film 214, respectively, provided so as to be in contact with the wiring 210, and a wiring part provided so as to be exposed outside the first opening 214a on the first polyimide resin film 214. Further, the pad electrode film 216 can be configured such that a central part thereof is formed so as to be recessed, and a predetermined region of the central part is formed flat. The flip chip bump 220 is provided so as to be in contact with the predetermined flat region of the central part of the pad electrode film 216, and the outer edge of a contact region between the flip chip bump 220, and the pad electrode film 216 exists inside a region of the outer edge of the predetermined flat region of the pad electrode film 216. With the adoption of such a configuration as described, when the second polyimide resin film 218 is formed on the pad electrode film 216, the via part of the flip chip bump 220 can be embedded in the second polyimide resin film 218, and the second polyimide resin film 218 is formed around the sidewall of the via part.

With the present embodiment, the semiconductor device can be configured such that the first polyimide resin film 214 is formed in a region directly underneath the outer edge of the pad electrode film 216 so as to be in contact with the pad electrode film 216. Further, with the present embodiment, the second polyimide resin film 218 exists between the flip chip bump 220 and the pad electrode film 216, in a region directly underneath the outer edge of the flip chip bump 220, as seen in a plan view. For this reason, the second polyimide resin film 218 can absorb stress acting on the pad electrode film 216 through the intermediary of the flip chip bump 220.

Further, an external electrode 222 made of, for example, solder, and so forth, electrically connected to the flip chip bump 220, is formed on the surface of the flip chip bump 220. With the adoption of such a configuration as described, the wiring 210 is electrically connected to the external electrode 222 through the intermediary of the pad electrode film 216, and the flip chip bump 220.

With the present embodiment, the semiconductor device has a structure in which the wiring 210, the pad electrode film 216, and the flip chip bump 220 are stacked directly above one after another in this order. That is, it can be configured such that the wiring 210, the pad electrode film 216, and the flip chip bump 220 include respective regions overlapping each other, as seen in a plan view. By so doing, connection directly underneath respective metal layers can be made between the metal layers with each other, so that it is possible to enhance adhesiveness, and an advantageous effect of preventing exfoliation.

Figure 2:
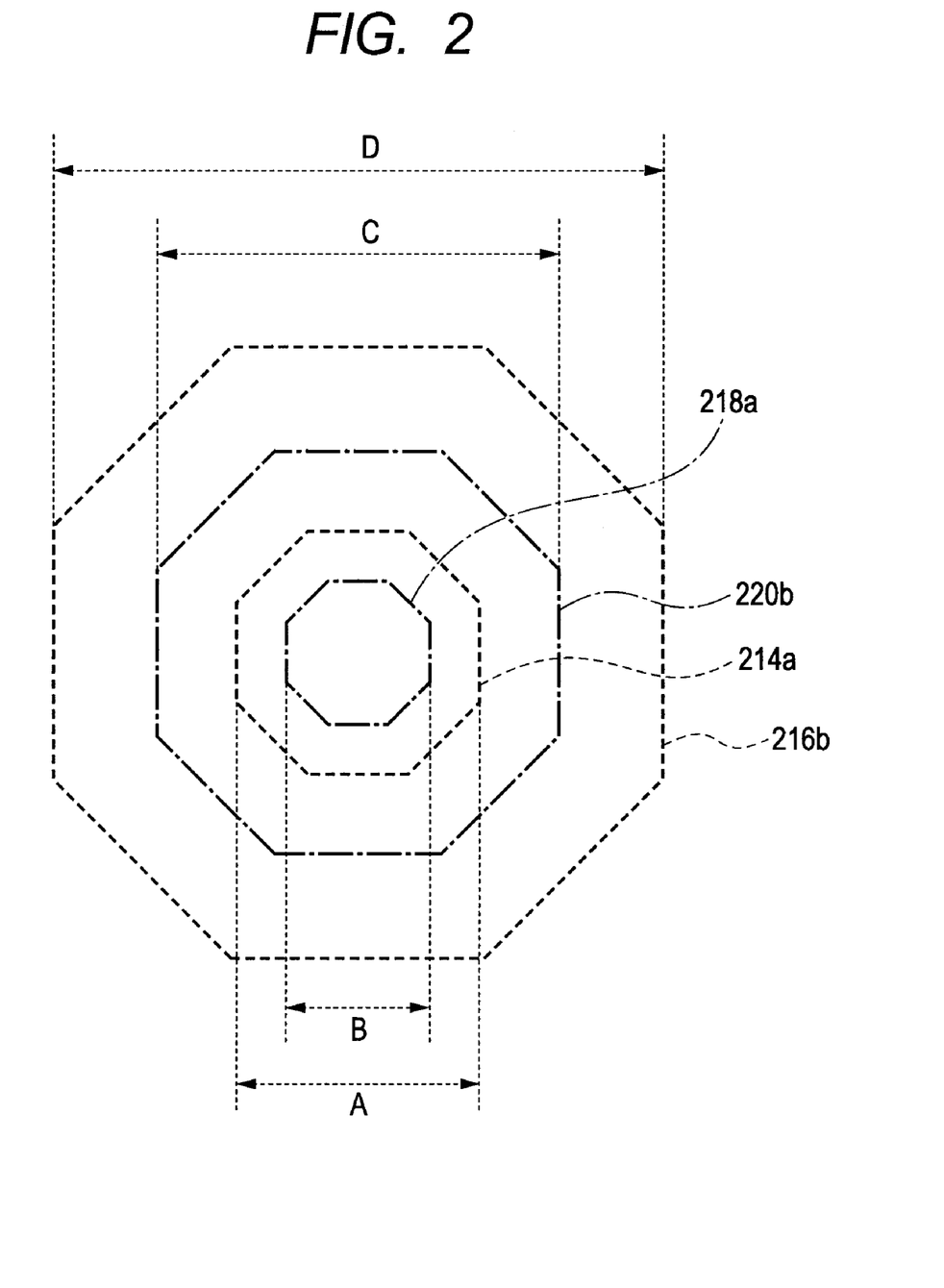
FIG. 2 is a plan view showing one example of the configuration of the semiconductor device according to the present embodiment.

FIG. 2 is a plan view showing one example of the configuration of the semiconductor device according to the present embodiment. In the figure, there is shown an example of a configuration, wherein the cover insulating film 212, the first opening 214a formed in the first polyimide resin film 214, an pad outer edge 216b of the pad electrode film 216, the second opening 218a formed in the second polyimide resin film 218, and an outer edge 220b of the flip chip bump 220 are each in the shape of an octagon in plane geometry. Further, in the figure, the first opening 214a, and the pad outer edge 216b are indicated by a broken line, respectively, and the second opening 218a, and the outer edge 220b are indicated by a dash and dotted line, respectively, for convenience in explanation. Further, all these elements can be laid out such that the respective centers thereof are superimposed on each other. More specifically, the pad electrode film 216, and the flip chip bump 220 can be configured such that the respective centers thereof are superimposed on each other, as seen in a plan view.

In this connection, the outer edge of the first opening 214a corresponds to the outer edge of a contact region between the wiring 210 and the pad electrode film 216. Further, the outer edge of the second opening 218a corresponds to the outer edge of the contact region between the flip chip bump 220, and the pad electrode film 216.

Further, there can be adopted a configuration wherein the wiring 210 as well is formed in the shape of an octagon in plane geometry although not shown in the figure, and the center thereof is superimposed on the respective centers of the pad electrode film 216, and so forth. Furthermore, the wiring 210 can be formed in other shapes including, for example, a rectangle.

With the present embodiment, the outer edge of the flip chip bump 220 (hereinafter referred to also as a bump outer edge 220b) is formed in a region inside the outer edge of the pad electrode film 216 (hereinafter referred to also as a pad outer edge 216b), as seen in a plan view. More specifically, the semiconductor device according to the present embodiment is configured such that the maximum diameter C of the flip chip bump 220 is smaller than the maximum diameter D of the pad electrode film 216. The maximum diameter C of the flip chip bump 220 can be in a range of, for example, about 50 to 120 μm, and can be 85 μm by way of example. Further, the maximum diameter D of the pad electrode film 216 can be in a range of, for example, about 55 to 200 μm, and can be 150 μm by way of example.

Thus, since the flip chip bump 220 is formed such the outer edge thereof is inside the region of the outer edge of the pad electrode film 216, and the pad electrode film 216 is in a shape extended outward so as to be wider than the flip chip bump 220, it is possible to block stress by the agency of the pad electrode film 216, and to more effectively relax stress propagated to a side of the device, adjacent to the semiconductor chip 202, through the intermediary of the flip chip bump 220. From such a point of view, if, for example, the respective centers of the pad electrode film 216, and the flip chip bump 220 are superimposed on each other, the maximum diameter D of the pad electrode film 216 can be rendered not less than about 1.1 times as large as the maximum diameter C of the flip chip bump 220.

Further, with the present embodiment, the semiconductor device can be formed such that the outer edge of the second opening 218a of the second polyimide resin film 218 is not superimposed on the outer edge of the first opening 214a of the first polyimide resin film 214, as seen in a plan view. More specifically, the via part in the flip chip bump 220 differs in via diameter from the via part in the pad electrode film 216. With the adoption of such a configuration as described, the semiconductor device can be configured such that the outer edge of the contact region between the wiring 210 and the pad electrode film 216, susceptible to be subjected to stress, is not superimposed on the outer edge of the contact region between the pad electrode film 216 and the flip chip bump 220, as seen in a plan view, thereby relaxing stress.

With this example, the outer edge of the contact region between the pad electrode film 216 and the flip chip bump 220 (the outer edge of the second opening 218a) is formed in a region inside the outer edge of the contact region between the wiring 210 and the pad electrode film 216 (the outer edge of the first opening 214a), as seen in a plan view. More specifically, with this example, the maximum diameter A of the first opening 214a at a part of the pad electrode film 216, in contact with the wiring 210, is rendered larger than the maximum diameter B of the second opening 218a at a part of the pad electrode film 216, in contact with the flip chip bump 220.

Herein, the maximum diameter A of the first opening 214a can be in a range of, for example, about 20 to 100 μm, and can be about 55 μm by way of example. Further, the maximum diameter B of the second opening 218a can be in a range of, for example, about 10 to 80 μm, and can be about 40 μm by way of example. The lower limit of an opening diameter of each of the openings can be set as appropriate on the basis of resolution of polyimide. Further, the upper limit of the opening diameter of each of the openings can be set as appropriate on the basis of the maximum diameter C of the flip chip bump 220.

Figure 3:
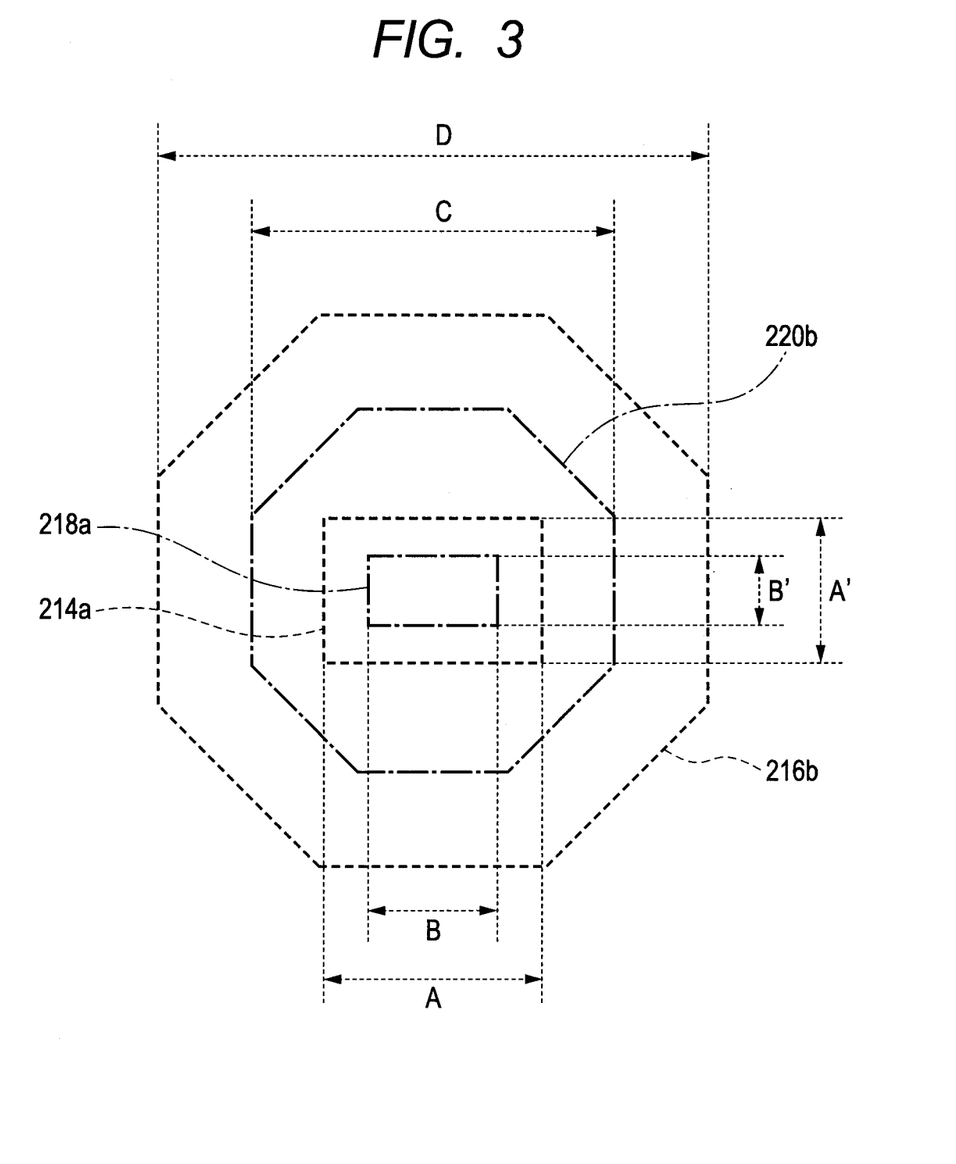
FIG. 3 is a plan view showing another example of the configuration of the semiconductor device according to the present embodiment.

FIG. 3 is a plan view showing another example of the configuration of the semiconductor device according to the present embodiment. In the figure, there is shown an example in which the first opening 214a formed in the cover insulating film 212, and the first polyimide resin film 214, and the second opening 218a formed in the second polyimide resin film 218 are each in the shape of a rectangle in plane geometry, differing in shape from the example shown in FIG. 2. Use can be made of a configuration wherein the pad outer edge 216b of the pad electrode film 216, and the outer edge 220b of the flip chip bump 220 are each in the shape of the octagon in plane geometry, as in the case of the example shown in FIG. 2. Further, with this example as well, all these elements can be laid out such that the respective centers thereof are superimposed on each other.

With this example as well, the semiconductor device can be formed such that the outer edge of the second opening 218a of the second polyimide resin film 218 is not superimposed on the outer edge of the first opening 214a of the first polyimide resin film 214, as seen in a plan view. With the present example, the outer edge of the second opening 218a is formed in a region inside the outer edge of the first opening 214a, as seen in a plan view. With the present example, a width A of the first opening 214a of the first polyimide resin film 214, in the longitudinal direction thereof, is larger than a width B of the second opening 218a of the second polyimide resin film 218, in the longitudinal direction thereof. Further, a width A' of the first opening 214a of the first polyimide resin film 214, in the transverse direction thereof, is larger than a width B' of the second opening 218a of the second polyimide resin film 218, in the transverse direction thereof. In this case, the width A of the first opening 214a of the first polyimide resin film 214, in the longitudinal direction thereof, can be in a range of, for example, about 25 to 100 μm, and can be about 45 μm by way of example while the width A' of the first opening 214a, in the transverse direction thereof, can be in a range of, for example, about 20 to 60 μm, and can be about 30 μm by way of example. Further, the width B of the second opening 218a, in the longitudinal direction thereof, can be in a range of, for example, about 15 to 90 μm, and can be about 35 μm by way of example while the width B' of the second opening 218a, in the transverse direction thereof, can be in a range of, for example, about 10 to 50 μm, and can be about 20 μm by way of example.

Now, there is described a procedure for manufacturing the semiconductor device 200 according to the present embodiment. FIGS. 4 to 8 each are a sectional view showing one example of a process step in the procedure for manufacturing the semiconductor device 200 according to the present embodiment.

Figure 4A:
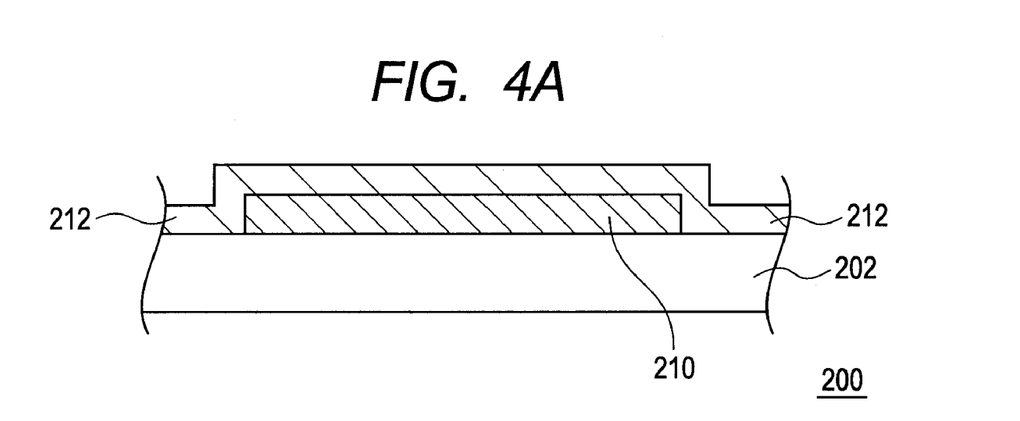
FIG. 4A and FIG. 4B are sectional views showing one example of a process step in the procedure for manufacturing the semiconductor device according to the present embodiment.
Figure 4B:
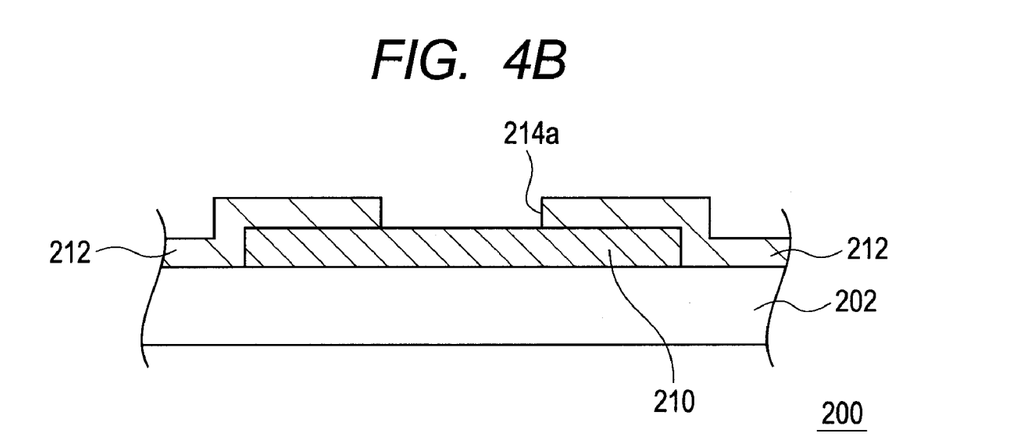
Figure 5A:
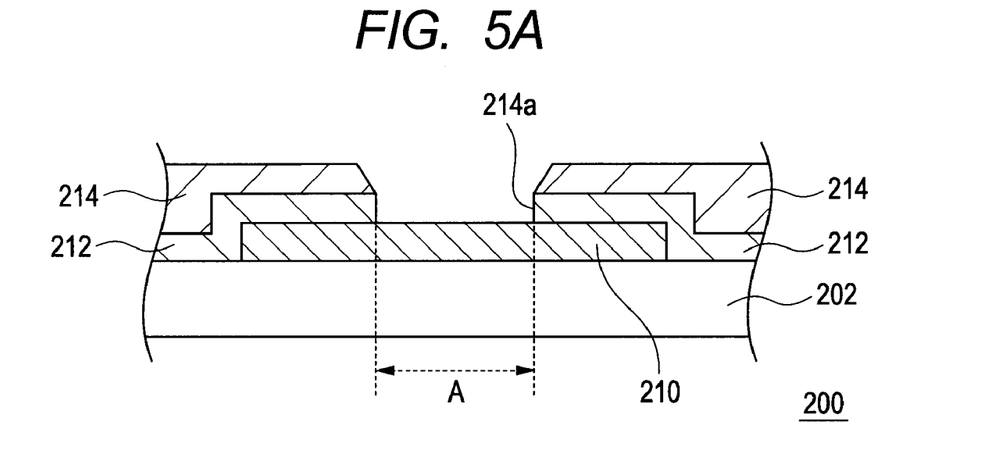
FIG. 5A and FIG. 5B are sectional views showing one example of a process step in the procedure for manufacturing the semiconductor device according to the present embodiment.

First, the cover insulating film 212 is formed across the surface of the semiconductor device 200 including the semiconductor chip 202 with the wiring 210 formed thereon (FIG. 4A). Subsequently, a resist pattern is formed on the cover insulating film 212, and the cover insulating film 212 is etched with the use of the resist pattern as a mask, thereby forming the first opening 214a in the cover insulating film 212 (FIG. 4B). Subsequently, the first polyimide resin film 214 having photosensitivity is formed on the cover insulating film 212, and exposure and development are applied thereto, thereby forming the first opening 214a in the first polyimide resin film 214 as well (FIG. 5A).

Figure 5B:
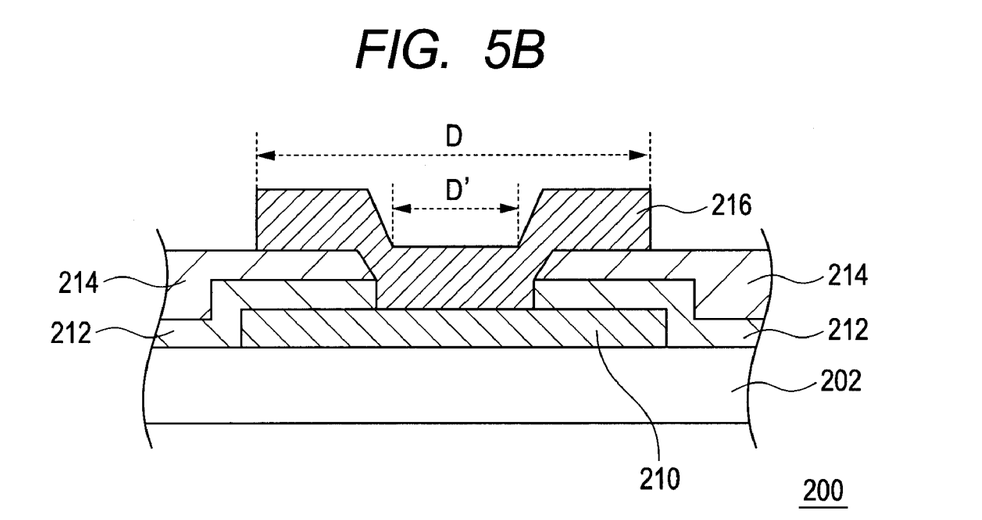

Thereafter, the pad electrode film 216 is formed on the first polyimide resin film 214 (FIG. 5B). The pad electrode film 216 can be formed in accordance with, for example, the following procedure. First, a barrier film made of Ti, TiN, and so forth, and a seed film of copper are formed across the surface of the first polyimide resin film 214 in this order by sputtering. Subsequently, a resist is patterned on the seed film to thereby open a portion of the resist, for forming the pad electrode film 216. Then, the pad electrode film 216 is formed by use of electroplating (copper plating). Thereafter, the resist is removed to thereby remove respective portions of the seed film, and the barrier film, other than the portion thereof, where a copper plated film has been formed, by etching. At this point in time, the maximum diameter of the outer edge of the pad electrode film 216 is defined as D, and the maximum diameter of a predetermined flat region at the center of the pad electrode film 216 is defined as D'.

Figure 6:
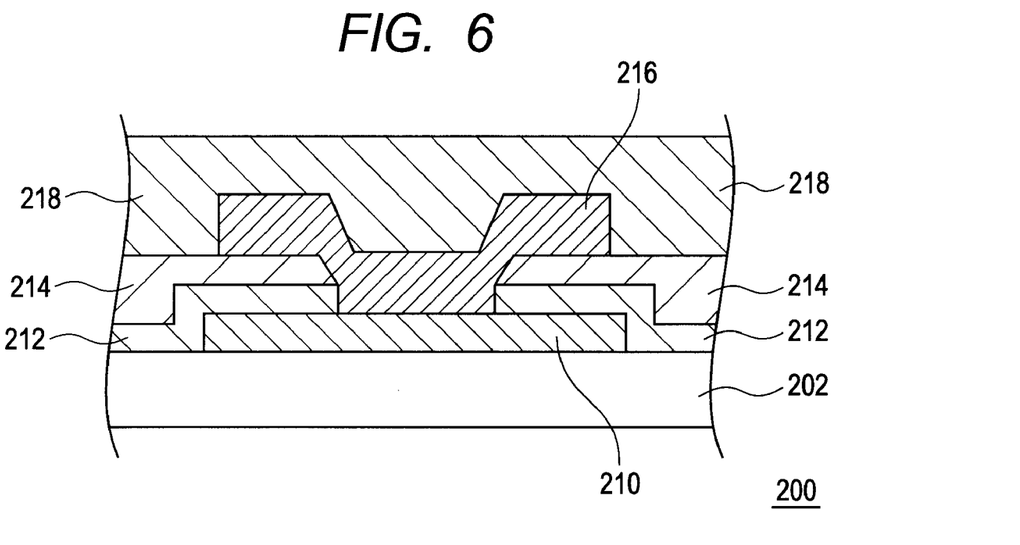
FIG. 6 is a sectional view showing one example of a process step in the procedure for manufacturing the semiconductor device according to the present embodiment.

Subsequently, the second polyimide resin film 218 having photosensitivity is formed on the pad electrode film 216, and the first polyimide resin film 214 (FIG. 6).

Figure 7:
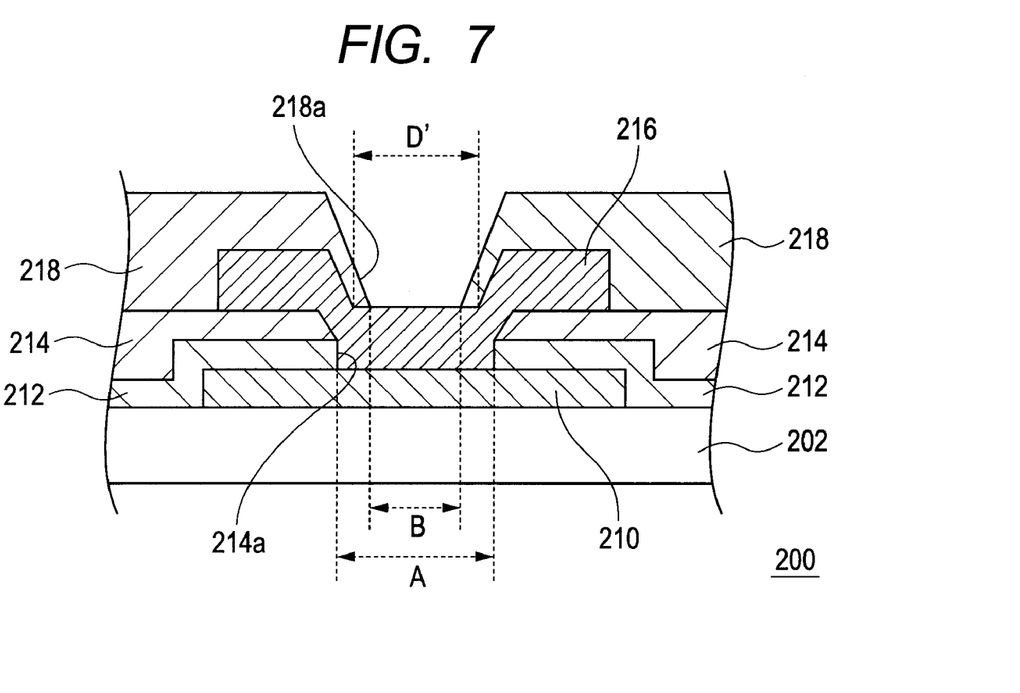
FIG. 7 is a sectional view showing one example of a process step in the procedure for manufacturing the semiconductor device according to the present embodiment.

Thereafter, exposure and development are applied to the second polyimide resin film 218, thereby forming the second opening 218a in the second polyimide resin film 218 (FIG. 7). With present embodiment, the second opening 218a is formed such that the outer frame thereof is placed inside a region of the outer frame of the first opening 214a. More specifically, it is possible to establish a relationship of the maximum diameter A of the first opening 214a>the maximum diameter B of the second opening 218a.

Further, with the present embodiment, the second opening 218a can be formed such that the outer edge thereof is positioned in a region inside the outer edge of a flat part at the central part of the pad electrode film 216. More specifically, the second opening 218a can be formed so as to establish a relationship of the maximum diameter D' of the flat part at the central part of the pad electrode film 216>the maximum diameter B of the second opening 218a. By so doing, when the flip chip bump 220 is formed on the pad electrode film 216, and the second polyimide resin film 218 later on, the second polyimide resin film 218 can be interposed between the via part of the pad electrode film 216, and the flip chip bump 220, so that stress can be further relaxed.

Figure 8:
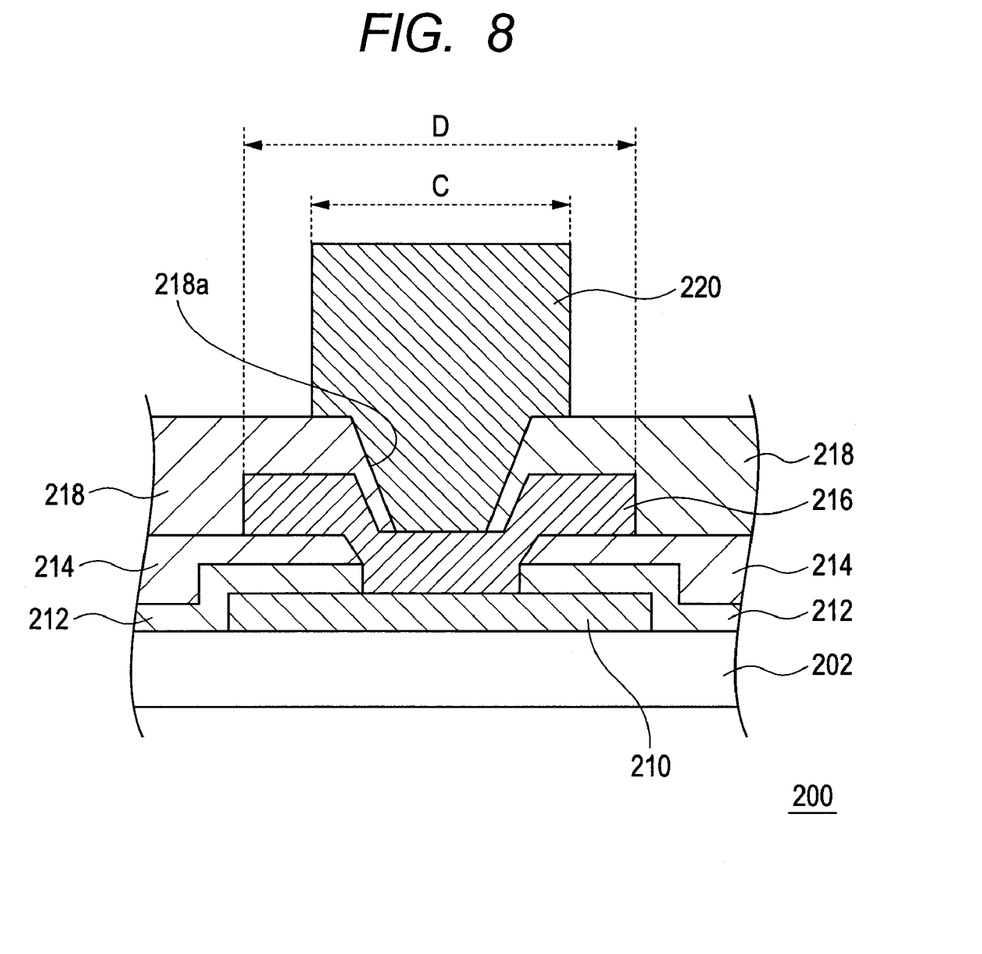
FIG. 8 is a sectional view showing one example of a process step in the procedure for manufacturing the semiconductor device according to the present embodiment.

Subsequently, the flip chip bump 220 is formed across the surface of the second polyimide resin film 218 (FIG. 8). The flip chip bump 220 can be formed in accordance with, for example, the following procedure. First, a barrier film made of Ti, TiN, and so forth, and a seed film of copper are formed in this order across the surface of the second polyimide resin film 218 by sputtering. Subsequently, a resist is patterned on the seed film to thereby open a portion of the resist, for forming the flip chip bump 220. Then, the flip chip bump 220 is formed by electroplating (copper plating, and solder plating are successively applied). Thereafter, the resist is removed to thereby remove respective portions of the seed film, and the barrier film, other than the portion thereof, where a plated film has been formed, by etching. Subsequently, reflow is carried out, and solder is once melted, thereby forming a smooth bump surface. By so doing, there is formed the external electrode 222 electrically connected with the flip chip bump 220. The external electrode 222 can be made of, for example, solder, and so forth. With the present embodiment, the flip chip bump 220 can be formed such that the outer edge of the pad electrode film 216 is positioned in a region outside of the outer edge of the flip chip bump 220. More specifically, it is possible in this case to establish a relationship of the maximum diameter D of the outer edge of the pad electrode film 216> the maximum diameter C of the outer edge of the flip chip bump 220.

Thus, the semiconductor device 200 having the configuration shown in FIG. 1 can be formed.

Figure 9:
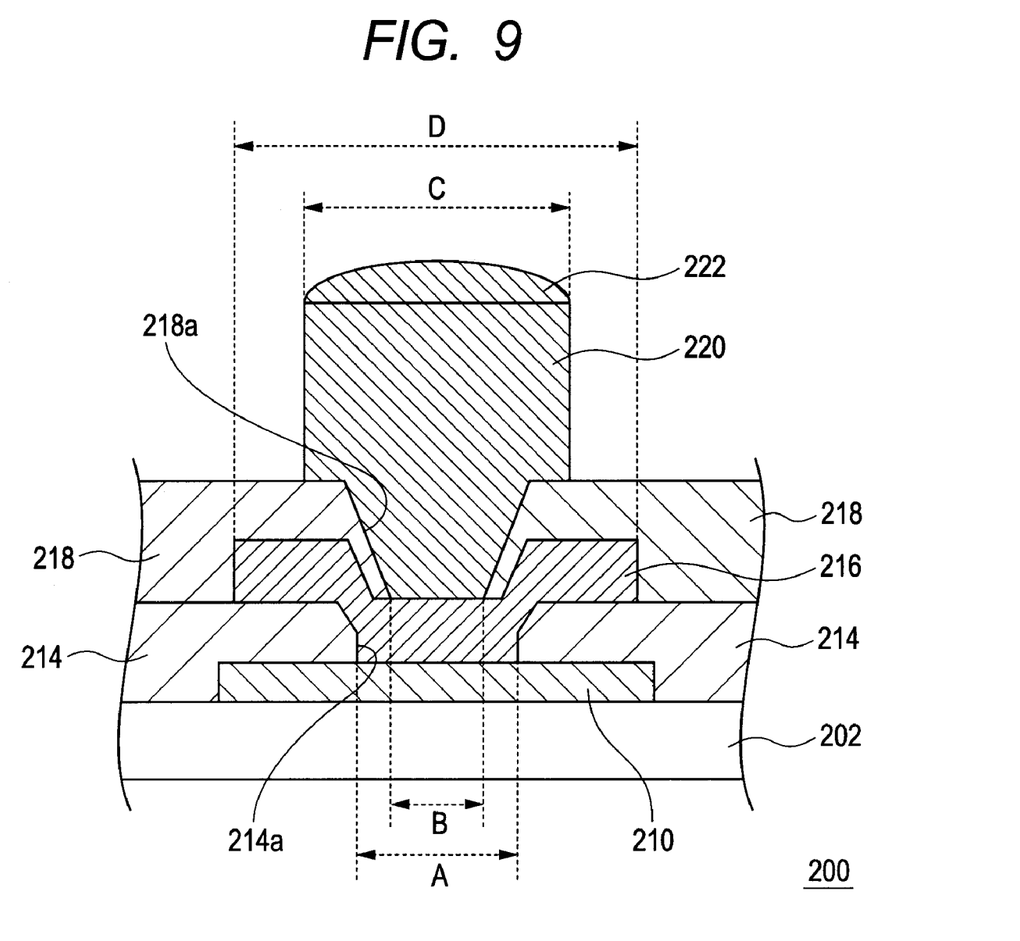
FIG. 9 is a sectional view showing another example of the configuration of the semiconductor device according to the embodiment of the invention.

Further, with the present embodiment, the semiconductor device 200 can have a configuration without the cover insulating film 212, as shown, for forming, in FIG. 9.

Now, there is described hereinafter the advantageous effect of the configuration of the semiconductor device 200 according to the present embodiment.

Figure 10:
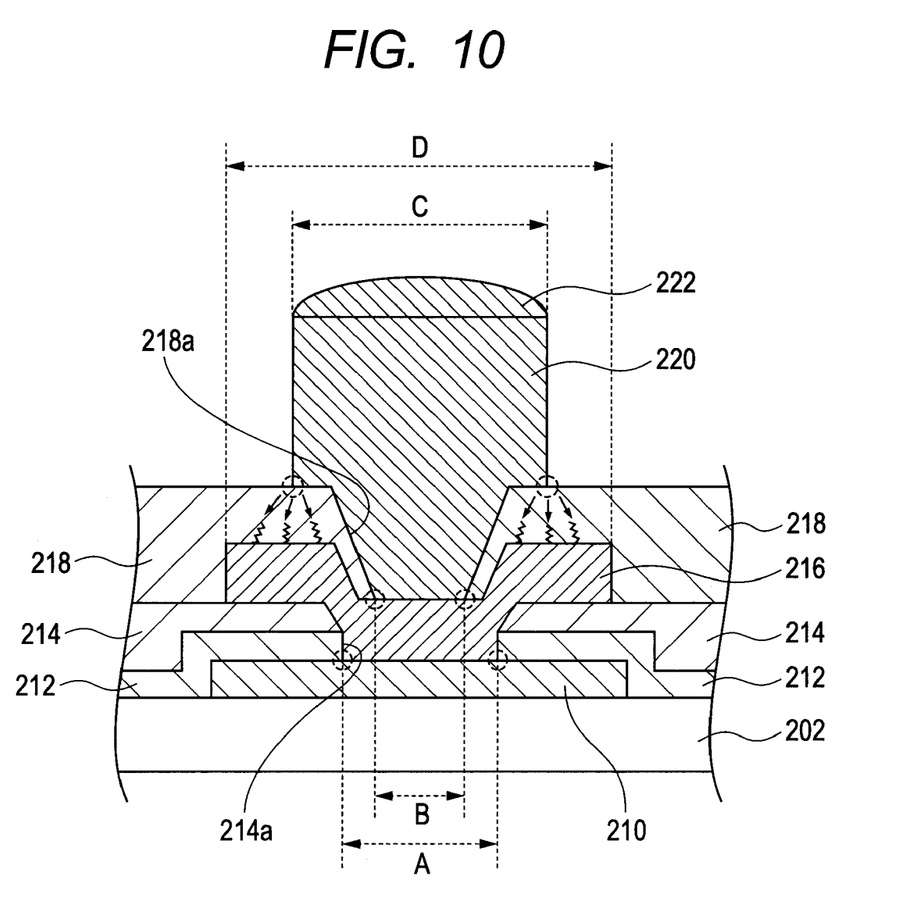
FIG. 10 is a sectional view illustrating the advantageous effect of the configuration of the semiconductor device according to the present embodiment.

FIG. 10 is a sectional view illustrating the advantageous effect of the configuration of the semiconductor device 200 according to the present embodiment.

When the flip chip bump 220 is connected to the printed circuit board, and so forth, the flip chip bump 220 is tilted due to contraction occurring to the printed circuit board. At this point in time, a large displacement occurs to the end parts (the outer edge) of the flip chip bump 220, whereupon stress acts on the corners indicated by broken lines in the figure. The stress acting on the flip chip bump 220 is propagated downward. With the configuration of the semiconductor device 200 according to the present embodiment, the second polyimide resin film 218 exists between the flip chip bump 220 and the pad electrode film 216, in a region directly underneath the outer edge of the flip chip bump 220, as seen in a plan view. For this reason, the second polyimide resin film 218 can absorb the stress acting on the pad electrode film 216 through the intermediary of the flip chip bump 220.

Further, the flip chip bump 220 is formed such the outer edge thereof is inside the region of the outer edge of the pad electrode film 216, and the pad electrode film 216 is in the shape extended outward so as to be wider than the flip chip bump 220. Accordingly, it is possible to block stress by the agency of the pad electrode film 216, and to more effectively relax stress propagated to the side of the device, adjacent to the semiconductor chip 202, through the intermediary of the flip chip bump 220. As a result, it is possible to inhibit breakdown otherwise occurring to the insulating film (the insulating film low in dielectric constant, in particular) in the semiconductor chip 202. Further, it is also possible to inhibit exfoliation of the flip chip bump 220 from the semiconductor chip 202.

Further, the pad electrode film 216 is sandwiched between the second polyimide resin film 218, and the first polyimide resin film 214. Still further, the second polyimide resin film 218 is provided between the flip chip bump 220, and the pad electrode film 216. Furthermore, the flip chip bump 220 is provided with the via part small in diameter, and the second polyimide resin film 218 is formed around the sidewall of the via part. Accordingly, stress in the via part of the flip chip bump 220 can be dispersed in the second polyimide resin film 218, thereby relaxing the stress.

Further, with the present embodiment, a configuration is adopted such that the outer edge of the second opening 218a of the second polyimide resin film 218 is not superimposed on the outer edge of the first opening 214a of the first polyimide resin film 214, as seen in a plan view. In the case where there are provided two layers of polyimide resin films including the first polyimide resin film 214, and the second polyimide resin film 218, displacement occurs to the bottom of the via part in the flip chip bump 220, as well, as indicated by broken lines in the figure, as a result of the flip chip bump 220 being tilted due to the contraction occurring to the printed circuit board. Furthermore, due to displacement occurring to the flip chip bump 220, displacement also occurs in the neighborhood of the bottom of the via part in the pad electrode film 216 to which the flip chip bump 220 is connected, as indicated by broken lines in the figure. With the present embodiment, since these via holes differ in diameter from each other, it is possible to adopt a configuration wherein respective positions of the via holes, under stress, are not superimposed on each other, as seen in a plan view, thereby relaxing stress. By so doing, it is possible to inhibit the breakdown otherwise occurring to the insulating film (the insulating film low in dielectric constant, in particular) in the semiconductor chip 202.

Further, with the present embodiment, the semiconductor device has the structure wherein the wiring 210, the pad electrode film 216, and the flip chip bump 220 are stacked directly above one after another in this order. By so doing, the connection directly underneath the respective metal layers can be made between the metal layers with each other, so that it is possible to enhance adhesiveness, and the advantageous effect of preventing exfoliation.

Further, since the pad electrode film 216 in the shape extended outward so as to be wider than the flip chip bump 220 is provided between the flip chip bump 220, and the first polyimide resin film 214, it is possible to increase adhesion strength between the metal layer and the insulating film, thereby enhancing durability against stress acting on the semiconductor chip 202.

As a result, solder-bump pull strength and solder-bump shear strength can be enhanced, so that it is possible to enhance reliability of the semiconductor device, in respect of resistance against stress attributable to a difference in coefficient of thermal expansion between the semiconductor device after mounted on the printed circuit board, and the printed circuit board.

Figure 11:
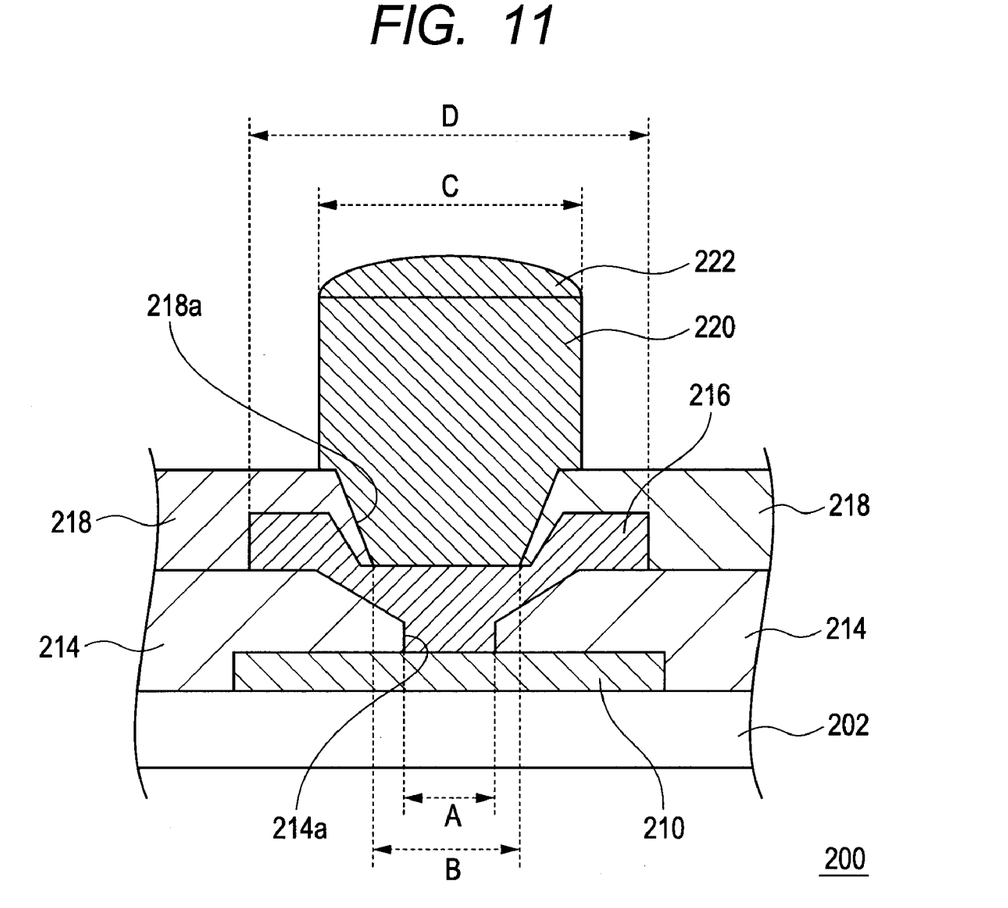
FIG. 11 is a sectional view showing another example of the configuration of the semiconductor device according to the present embodiment of the invention.

FIG. 11 is a sectional view showing another example of the configuration of the semiconductor device according to the present embodiment of the invention. With this example as well, the semiconductor device is configured such that the outer edge of a second opening 218a of a second polyimide resin film 218 is not superimposed on the outer edge of a first opening 214a of a first polyimide resin film 214, as seen in a plan view. With this example, however, the semiconductor device is formed such that the outer edge of the first opening 214a is in a region inside the outer edge of the second opening 218a, as seen in a plan view. More specifically, with this example, the maximum diameter B of the second opening 218a of second polyimide resin film 218 is rendered larger than the maximum diameter A of the first opening 214a of the first polyimide resin film 214. Even if such a configuration as described is adopted, a via part in the flip chip bump 220 differs in via diameter from a via part in the pad electrode film 216, and it is therefore possible to have a configuration wherein parts at positions subjected to stress are not superimposed on each other, as seen in a plan view, thereby relaxing stress. By s doing, it is possible to inhibit the breakdown otherwise occurring to the insulating film (the insulating film low in dielectric constant, in particular) in the semiconductor chip 202.

Having described the embodiment of the semiconductor device according to the invention with reference to the drawings as above, it is to be pointed out that such description is for illustrative purpose only, and that various configurations other than those described may be adopted in the invention without departing from the spirit or scope thereof.

With the embodiment of the semiconductor device according to the invention, described in the foregoing, there has been described the case where the first polyimide resin film 214, and the second polyimide resin film 218 are each a polyimide resin film by way of example; however, it is to be understood that those films may be replaced with an organic resin film including, for example, a polyetherimide resin film, an acrylic denatured epoxy resin film, a silicone resin film, and a PBO (polybenzoxazole) resin film.

What is claimed is:

1. A semiconductor device comprising:
a substrate;
a wiring formed on the substrate;
a first insulating film formed on the wiring, provided with a first opening for exposing a portion of the wiring;
a pad electrode film formed on the first insulating film, the pad electrode film being formed so as to be in contact with the entire surface of a portion of the wiring, exposed from the first opening of the first insulating film;
a second insulating film formed on the first insulating film and the pad electrode film, a second opening for exposing a portion of the pad electrode film being formed in the second insulating film; and
a flip chip bump formed on the second insulating film, the flip chip bump being formed in such a manner as to be in contact with the entire surface of a portion of the pad electrode film, exposed from the second opening of the second insulating film,
wherein the second insulating film exists between the flip chip bump and the pad electrode film, in a region directly underneath an outer edge of the flip chip bump, as seen in a plan view, and the outer edge of the flip chip bump is formed in a region inside the outer edge of the pad electrode film, as seen in a plan view.

2. The semiconductor device according to claim 1, wherein the first insulating film is formed in a region directly underneath the outer edge of the pad electrode film so as to be in contact with the pad electrode film.

3. The semiconductor device according to claim 1, wherein a multi-level interconnect structure is formed between the substrate, and the wiring.

4. The semiconductor device according to claim 1, wherein a multi-level interconnect structure including an insulating film low in dielectric constant is formed between the substrate, and the wiring.

5. The semiconductor device according to claim 1, wherein an outer edge of a contact region between the wiring and the pad electrode film is not superimposed on an outer edge of a contact region between the pad electrode film and the flip chip bump, as seen in a plan view.

6. The semiconductor device according to claim 1, wherein the wiring, the pad electrode film, and the flip chip bump include respective regions overlapping each other, as seen in a plan view.

7. The semiconductor device according to claim 1, wherein the respective centers of the wiring, the pad electrode film, and the flip chip bump are superimposed on each other, as seen in a plan view.

8. The semiconductor device according to claim 1, wherein the flip chip bump includes a via part formed in the second insulating film, provided in such a way so as to in contact with the pad electrode film, and a pillar part formed so as to be exposed outside the second opening on the second insulating film, the second insulating film being formed around a sidewall of the via part.

9. The semiconductor device according to claim 1, wherein the pad electrode film is formed such that a central part thereof is recessed, and a predetermined region of the central part is formed flat, and the flip chip bump is provided so as to be in contact with the predetermined region of the pad electrode film, the outer edge of the contact region between the flip chip bump, and the pad electrode film existing in a region inside the outer edge of the predetermined region of the pad electrode film.

10. The semiconductor device according to claim 1, wherein the second insulating film is an organic resin film.

11. The semiconductor device according to claim 1, wherein the second insulating film is a polyimide resin film.

12. The semiconductor device according to claim 1, wherein the first insulating film is a polyimide resin film.

13. The semiconductor device according to claim 1, wherein the outer edge of the contact region between the pad electrode film and the flip chip bump is formed in a region inside the outer edge of the contact region between the wiring and the pad electrode film, in a plan view.

14. The semiconductor device according to claim 1, wherein the outer edge of the contact region between the wiring and the pad electrode film is formed in a region inside the outer edge of the contact region between the pad electrode film and the flip chip bump, in a plan view.

* * * * *